US009136111B1

(12) United States Patent
Chu et al.

(10) Patent No.: US 9,136,111 B1
(45) Date of Patent: Sep. 15, 2015

(54) FIELD EFFECT TRANSISTORS WITH GATE ELECTRODES HAVING NI AND TI METAL LAYERS

(75) Inventors: Kanin Chu, Nashua, NH (US); Pane-Chane Chao, Nashua, NH (US); Kirby B. Nichols, Chelmsford, MA (US); Gabriel Cueva, Bedford, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 13/537,538

(22) Filed: Jun. 29, 2012

Related U.S. Application Data

(60) Provisional application No. 61/503,809, filed on Jul. 1, 2011.

(51) Int. Cl.
*H01L 29/15* (2006.01)
*H01L 21/02* (2006.01)

(52) U.S. Cl.
CPC ............................... *H01L 21/02458* (2013.01)

(58) Field of Classification Search
CPC ............ H01L 21/02458; H01L 21/0254; H01L 33/007; H01L 29/2003; H01L 33/32
USPC .............................................................. 257/76
See application file for complete search history.

(56) References Cited

U.S. PATENT DOCUMENTS

| 6,674,101 | B2 * | 1/2004 | Yoshida | 257/194 |
| 2003/0168334 | A1 * | 9/2003 | Rasmussen et al. | 204/192.15 |
| 2004/0197977 | A1 * | 10/2004 | Deleonibus | 438/202 |
| 2006/0063314 | A1 * | 3/2006 | Hokazono | 438/142 |
| 2010/0276807 | A1 * | 11/2010 | Hsu et al. | 257/771 |
| 2011/0049627 | A1 * | 3/2011 | Chang et al. | 257/347 |

OTHER PUBLICATIONS

John Foggiato et al., Optimizing the Formation of Nickel Silicide, 114-115 Materials Science and Engineering B, 56-60 (2004).*
Ohki, T., "Effect of Gate Edge Silicidation on Gate Leakage Current in AlGaN/GaN HEMTs", CS Mantech Conf., Apr. 14-17 2008, Chicago, IL.
Balmer, R.S., "Analysis of Thin AlN Carrier Exclusion Layers in AlGaN/GaN Microwave Heterojunction FETs", Semicond. Sci. Tech., 2004, pp. L65-L67, vol. 19.
Matsushita, K., "Reliability Study of AlGaN/GaN HEMTs Devices", CS Mantech Conf., May 14-17, 2007, Austin, TX.
Alekseev, E., "Broadband AlGaN/GaN HEMT MMIC Attenuators With High Dynamic Range", 30th European Microwave Conf., 2000.
Jeon, C.M. et al., "Effects of Tensile Stress Induced by SiN Passivation on Electrical Characteristics of AlGaN/GaN Heterostructure FETs", Applied Phys. Lett., 2005, vol. 86, 172101.
Jimenez, J.L. et al., "X-Band GaN FET Reliability", IEEE 46th Annual Int. Reliability Physics Symp., 2008, pp. 429-435.
Zhihua Dong et al., "High breakdown AlGaN/GaN MOSHEMT with thermal oxidized Ni/Ti as gate insulator", Solid-State Electronics, vol. 54, Issue 11, Nov. 2010, pp. 1339-1342.

* cited by examiner

*Primary Examiner* — Anthony Ho
(74) *Attorney, Agent, or Firm* — Andrew P. Cernota; Maine Cernota & Rardin; Daniel J. Long

(57) ABSTRACT

A field effect transistor and method for making such a transistor is provided, the field effect transistor comprising: a gate layer stack comprising a layer of a first metal is disposed proximate to at least one layer of a second metal, wherein the first metal alloys with the second metal to form a shape memory alloy. The shape metal allow may be NiTi, and at the contact plane between the layers, the alloy is formed when the transistor is heated to an elevated temperature.

16 Claims, 6 Drawing Sheets

FIELD EFFECT TRANSISTORS WITH GATE ELECTRODES HAVING NI AND TI METAL LAYERS

RELATED APPLICATIONS

This application claims the benefit of U.S. Provisional Applications No. 61/503,809, filed Jul. 1, 2011. This application is herein incorporated by reference in its entirety for all purposes.

FIELD OF THE INVENTION

The present invention relates to field effect transistors and more particularly to GaN-based field effect transistors.

BACKGROUND OF THE INVENTION

GaN HEMT and GaN MISFET devices have been used in the prior art. It is found, however, that such devices may have a certain degree of unreliability when the GaN epi material has high stress.

Typical gate metal, such as Ni/Au, produces a compressive stress on the GaN HEMTs operating at elevated channel temperatures. The compressive stress, which is a function of temperature, reduces carrier charge density in the device channel and can also generate a crack in the semiconductor material near the drain side of the gate edge, thereby shortening the device lifetime.

What is needed, therefore, are techniques to improve the reliability of such GaN devices.

SUMMARY OF THE INVENTION

One embodiment of the present invention provides a field effect transistor having improved reliability; the field effect transistor having a gate layer stack comprising a layer of a first metal is disposed proximate to at least one layer of a second metal, wherein the first metal alloys with the second metal to form a shape memory alloy.

Another embodiment of the present invention provides such a system wherein the layer of a first metal is nickel and the layer of a second metal is Titanium.

A further embodiment of the present invention provides such a system wherein the layer of the first metal is disposed not more than 200 Å from the layer of the second metal.

Yet another embodiment of the present invention provides such a system wherein the layer of the first metal and the layer of the second metal are at least partially alloyed at a fusion plane.

A yet further embodiment of the present invention provides such a system wherein the fusion plane comprises a layer of Nickel-Titanium alloy disposed between the layer of the first metal and the layer of the second metal.

Still another embodiment of the present invention provides such a system wherein the transistor is a High Electron Mobility Transistor (HEMT).

A still further embodiment of the present invention provides such a system wherein the transistor is a pseudomorphic High Electron Mobility Transistor (pHEMT).

Even another embodiment of the present invention provides such a system wherein the transistor is a metamorphic High Electron Mobility Transistor (mHEMT).

An even further embodiment of the present invention provides such a system wherein the transistor is a metal-insulator-semiconductor field effect transistor (MISFET).

Still yet another embodiment of the present invention provides such a system wherein the transistor is a GaN transistor.

A still yet further embodiment of the present invention provides such a system wherein the transistor is a InP transistor.

A still yet further embodiment of the present invention provides such a system wherein the transistor is a GaAs transistor.

Even another embodiment of the present invention provides such a system wherein the layer of the second metal is about approximately 30 Å.

An even still further embodiment of the present invention provides such a system wherein the layer of the first metal is between about approximately 100 Å and about approximately 1000 Å.

One embodiment of the present invention provides a method for the manufacture of a gate layer stack, the method having the steps of: disposing a Titanium layer proximate to a Nickel layer within a gate layer stack; exposing the gate layer stack to elevated temperatures fusing the Titanium layer to the Nickel layer and forming a layer of NiTi alloy.

Another embodiment of the present invention provides such a method wherein the Titanium layer is about approximately 30 Å.

A further embodiment of the present invention provides such a method wherein the Nickel layer is between about approximately 100 Å and about approximately 1000 Å.

Yet another embodiment of the present invention provides such a method wherein the elevated temperature is about approximately 260° C. or a high enough temperature to allow for the creation of NiTi alloy at the interface between the layers of titanium and nickel.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

According to one embodiment of the present invention a gate metal stack containing both Ni and Ti metal layers is used in the GaN device. In alternative embodiments, one skilled in the art could select metals with alternative shape memory alloys, such as shape memory alloys of zinc, copper, gold and iron. The Ni and Ti metal layers have a physical separation of 200 Å or less, allowing the formation of a NiTi alloy during device fabrication or operation at elevated temperatures. The NiTi alloy forms a tensile stress on the device at high temperatures, enhancing channel conduction and minimizing the formation of an epi crack on the drain side of the gate edge during high voltage operation at elevated temperatures. This leads to improved GaN device long-term reliability. It should be noted that the same principal also applies to the GaAs HEMT devices to reduce piezoelectric effect for improved stability leading to longer lifetime.

Various embodiments of the present invention yield device reliability that is significantly improved over that of Ni/Au gate layers by inserting a thin Ti layer next to or nearby the Ni metal layer in the gate metal stack. Ni and Ti layers can also be incorporated into gate of other III-V compound based transistors like GaAs PHEMT, GaAs MHEMT and InP HEMT to reduce device piezoelectric effect for improved stability during wafer processing and device operation. Since Ti is typically used as the Schottky in GaAs PHEMT and InP HEMT devices, a thin Ni metal (for example, 20-30 Å) can be inserted inside the Ti metal layer or on top of the Ti layer.

Figure 1:
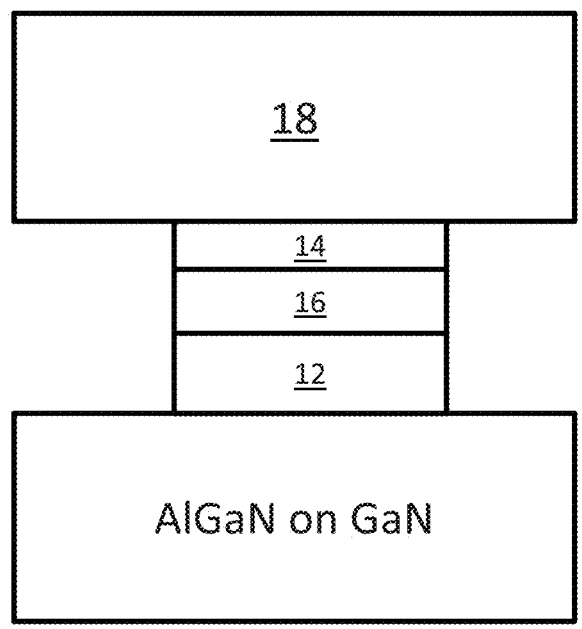
FIG. 1 is a cross sectional drawing illustrating a gate metal structure configured in accordance with one embodiment of the present invention.
Figure 2:
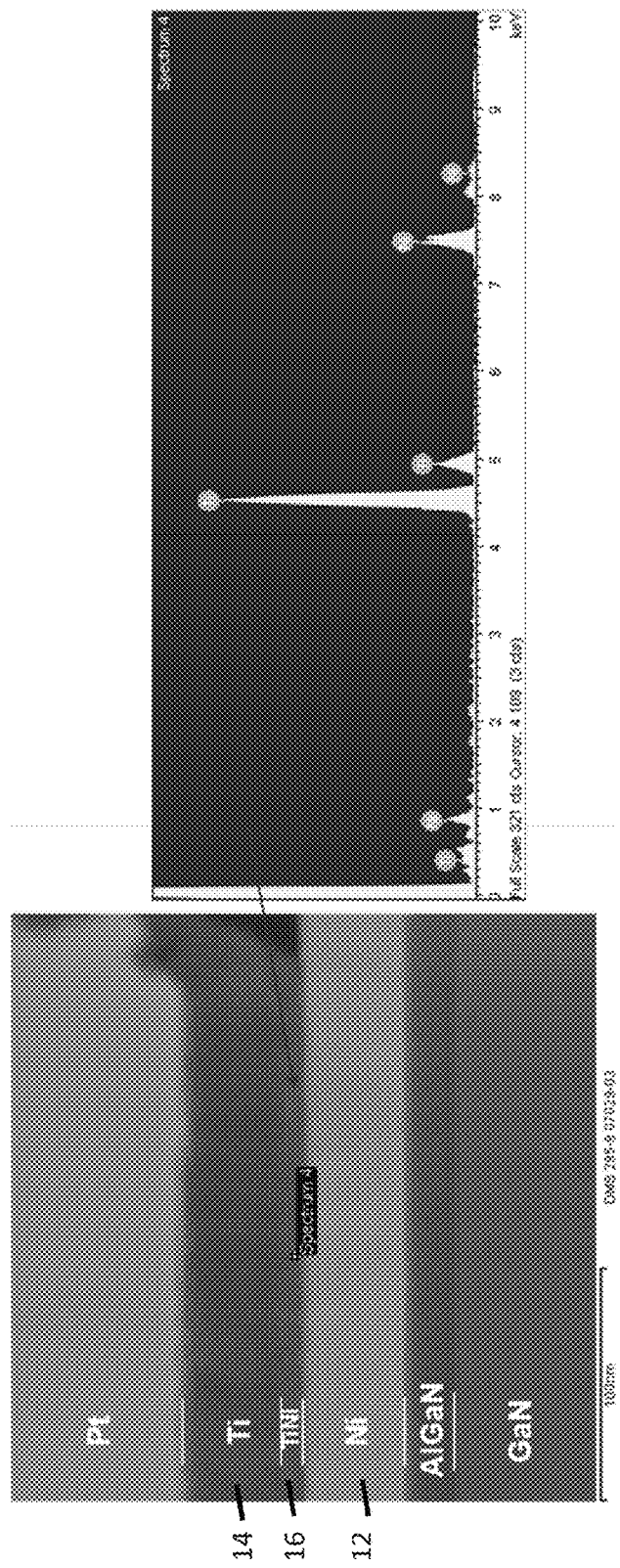
FIG. 2 is a photograph illustrating a gate metal structure configured in accordance with one embodiment of the present invention illustrating an interfacial NiTi layer.
Figure 3:
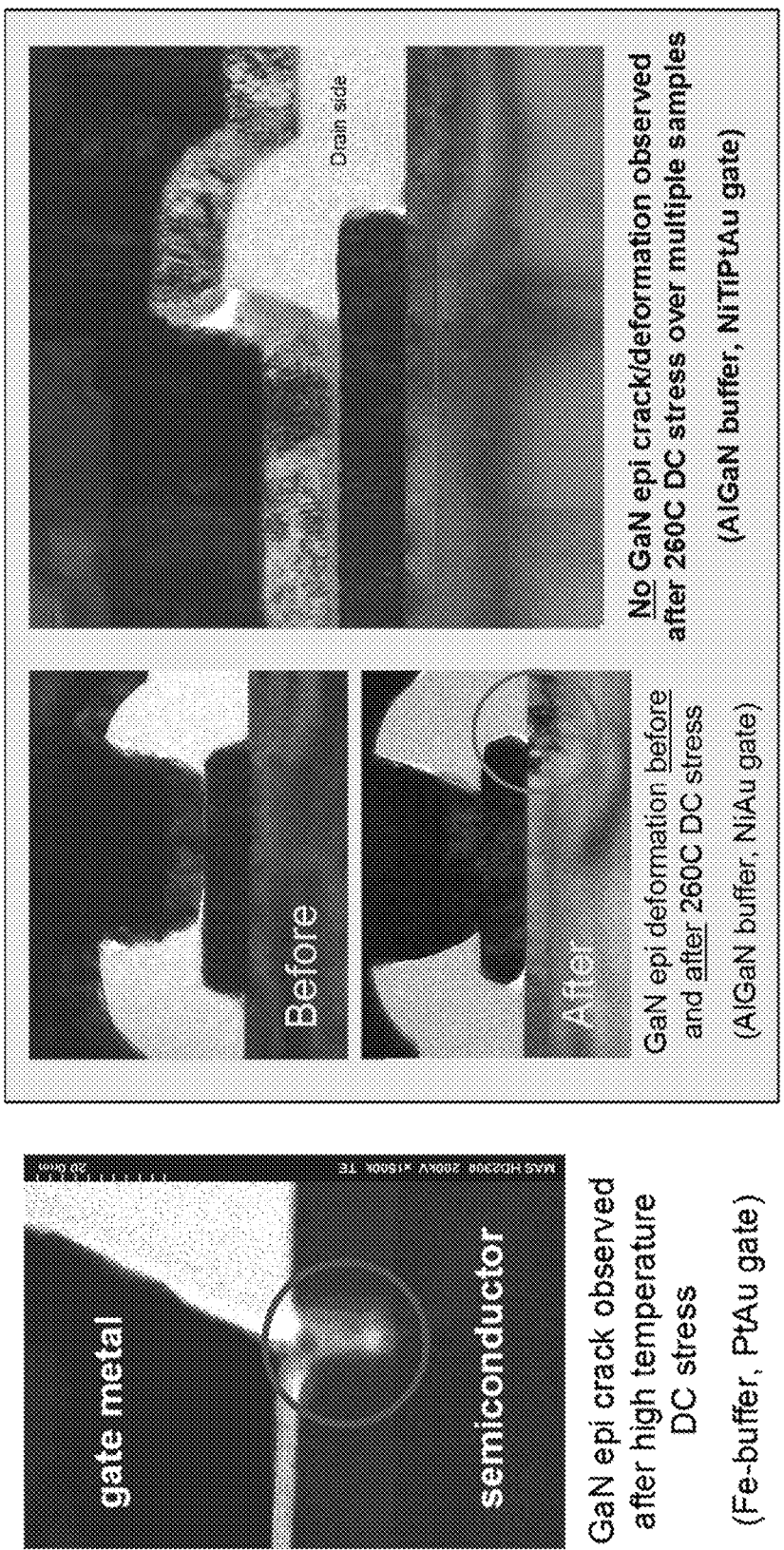
FIG. 3 is a photograph illustrating a gate metal structure configured in accordance with one embodiment of the present invention illustrating an interfacial NiTi layer after a life test at high temperature.
Figure 4:
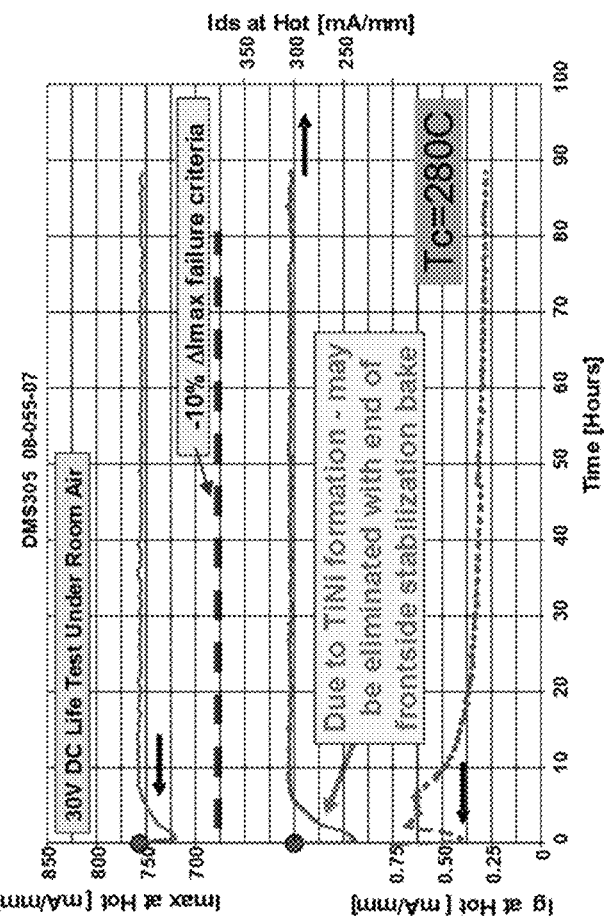
FIG. 4 is a graph illustrating a improved performance of a gate metal structure configured in accordance with one embodiment of the present invention.
Figure 4:
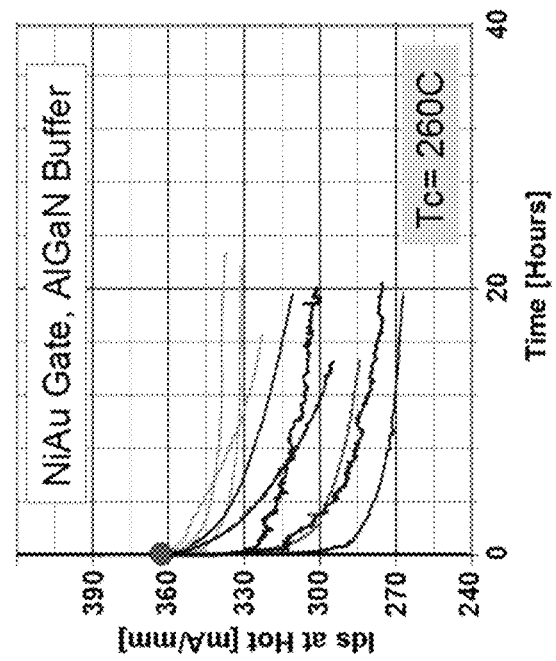

One embodiment of the present invention provides a new gate metal stack, containing both Ni and Ti metal layers 12,14, in the GaN device (FIG. 1). The Ni and Ti metal layers 12,14 have a less than 200 Å separation from each other, allowing a formation of a NiTi alloy 16 at elevated temperatures (FIG. 2). The NiTi alloy 16 forms a tensile stress on the device, which enhances channel conduction and reduces formation of an epi crack on the drain side of the gate edge during high voltage operation at elevated temperatures (FIG. 3) leading to improved GaN device long-term reliability (FIG. 4).

In one embodiment of the present invention, illustrated in FIG. 1, a gate structure is provided containing both Ni and Ti with the GaN HEMT. Ni and Ti layers 12, 14 are close to each other (in one embodiment, less than 200 Å in separation) for a possible interaction to form a NiTi alloy 16. To avoid the generation of an excessive tensile stress and, therefore, excessive device current, the thickness of NiTi alloy 16 should be optimized, meaning that either Ti or Ni thickness should be optimized. In one embodiment, it was found that with a typical Ni metal 12 thickness of 100-1000 Å in conjunction with a Ti thickness 14 of ~30 Å is effective in enhancing GaN device reliability. Ti and Ni layers 14, 12 can be anywhere in the gate metal stack, as long as they allows a formation of a NiTi alloy during device fabrication, operation or testing.

As illustrated in FIG. 1, which is a vertical cross sectional schematic drawing showing gate metal structure in a GaN HEMT, showing Ni as the Schottky metal 12 with Ti 14 on top of it to allow formation of a NiTi layer 16. A layer of Titanium 14 is disposed on top of a layer of Nickel 12 in a gate stack. Gold 18 lowers the device gate resistance for high microwave performance. One skilled in the art will appreciate that Platinum (as illustrated in FIG. 5B) may be added on top of the Titanium layer to serve as a gold diffusion barrier;

FIG. 2 provides a photograph and graph showing Ti and Ni metal layers 12,14 form an interfacial NiTi layer 16 at about approximately 260° C. As illustrated, a thin band of NiTi is present and is disposed between bands of Nickel and Titanium. This thin band contributes to high reliability in GaN HEMTs and MMICs. As illustrated in FIG. 3 no cracks were observed in GaN HEMTs with gate containing Ni/Ti during high temperature life test under 260° C. DC stress while such cracks are clearly evident in known NiAu gate systems.

Figure 5A:
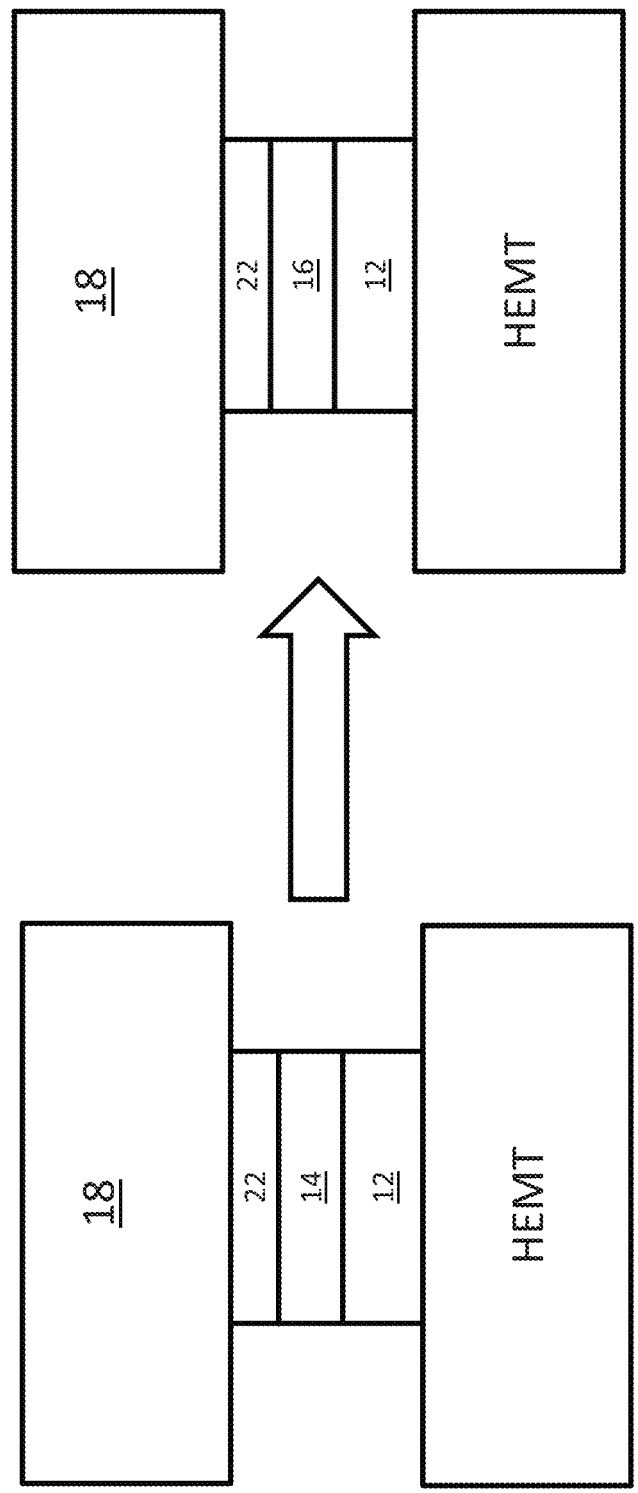
FIG. 5A is a cross sectional drawing illustrating a gate metal structure configured in accordance with an alternative embodiment of the present invention.
Figure 5B:
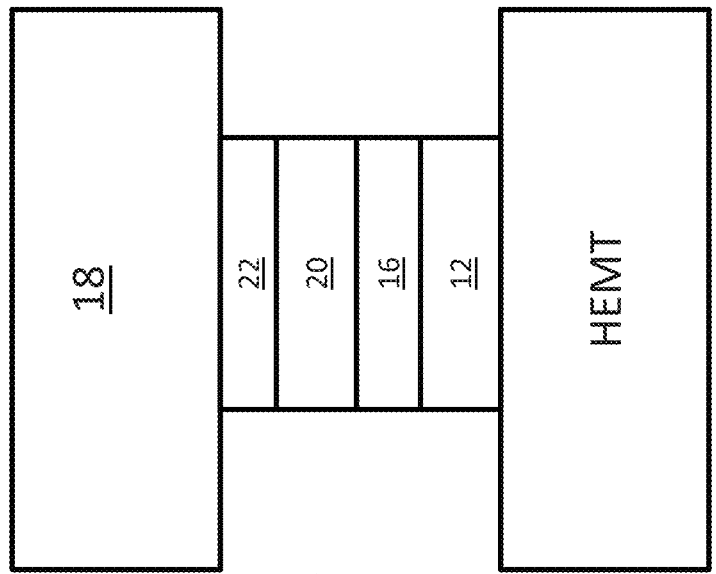
FIG. 5B is a cross sectional drawing illustrating a gate metal structure configured in accordance with another alternative embodiment of the present invention.
Figure 5B:
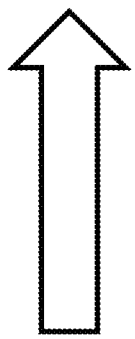
Figure 5B:
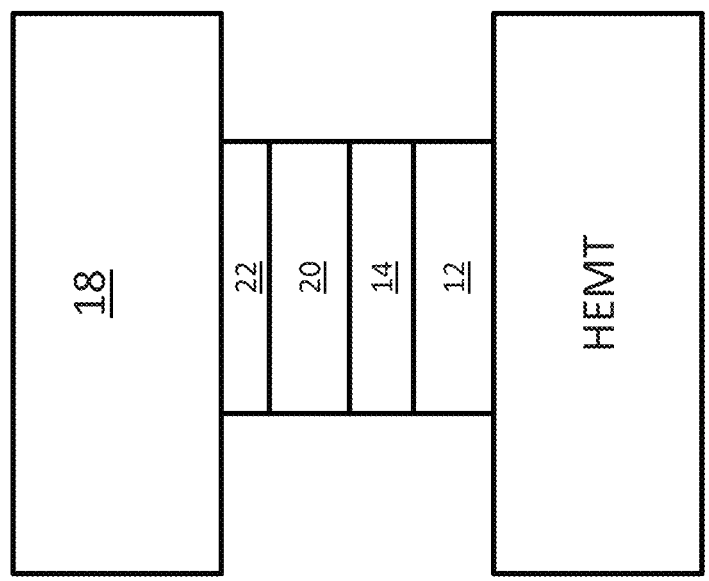

As illustrated in FIG. 4 a significantly improved GaN device stability at high operating temperature is provided when equipped with Ni/Ti-based gate. In comparison, the conventional Ni/Au gate without Ti has consistently shown a large current degradation within a short test period;

In alternative embodiments of the present invention, shown in FIGS. 5A and 5B, such a gate approach is applicable to the GaAs HEMT and InP HEMT to improve device reliability. As illustrated in FIG. 5A, a titanium layer 12 is disposed between the Nickel layer 14 and the HEMT, while as illustrated in FIG. 5B, an additional layer of Titanium 20 is disposed between the nickel 14 and the platinum layers 22. In both embodiments, the Nickel layer 12 becomes completely infused with Titanium yielding an interfacial NiTi layer 16. With increased temperature to about approximately 260° C., the NiTi alloy will assume a ratio or Ni to Ti and crystal structure with the desired electrical and physical characteristics.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A field effect transistor having improved reliability, the field effect transistor comprising:
 a gate layer stack comprising a layer of a first metal is disposed proximate to at least one layer of a second metal, wherein said first metal is at least partially alloyed with said second metal at a fusion plane to form an in-plane stress relief layer of shape memory alloy; and
 said field effect transistor is a field effect transistor wherein said layer of said first metal of said gate layer stack is fabricated directly on group III-V compounds.

2. The field effect transistor of claim 1 wherein said layer of a first metal is nickel and said layer of a second metal is Titanium.

3. The field effect transistor of claim 1 wherein said layer of said first metal is disposed not more than 200 Å from said layer of said second metal.

4. The field effect transistor of claim 1 wherein said fusion plane comprises a layer of Nickel-Titanium alloy disposed between said layer of said first metal and said layer of said second metal.

5. The field effect transistor of claim 1 wherein said transistor is a High Electron Mobility Transistor (HEMT).

6. The field effect transistor of claim 5 wherein said transistor is a pseudomorphic High Electron Mobility Transistor (pHEMT).

7. The field effect transistor of claim 5 wherein said transistor is a metamorphic High Electron Mobility Transistor (mHEMT).

8. The field effect transistor of claim 1 wherein said transistor is a metal-insulator-semiconductor field effect transistor (MISFET).

9. The field effect transistor of claim 1 wherein said transistor is a GaN transistor.

10. The field effect transistor of claim 1 wherein said transistor is a InP transistor.

11. The field effect transistor of claim 1 wherein said layer of said second metal is approximately 30 Å.

12. The field effect transistor of claim 1 wherein said layer of said first metal is between approximately 100 Å and about approximately 1000 Å.

13. A method for the manufacture of a gate layer stack in a III-V compound field effect transistor, said method comprising:
- disposing a Titanium layer proximate to a Nickel layer within a gate layer stack said gate layer stack being disposed such that either said nickel layer or said titanium layer is directly on a III-V compound layer;
- exposing said gate layer stack to elevated temperatures fusing said Titanium layer to said Nickel layer and forming an in-plane stress relief layer of NiTi alloy.

14. The method of claim 13 wherein said Titanium layer is approximately 30 Å.

15. The method of claim 13 wherein said Nickel layer is between approximately 100 Å and approximately 1000 Å.

16. The method of claim 13 wherein said elevated temperature is approximately 260° C.

* * * * *